United States Patent [19]

Mote, Jr.

[11] Patent Number: 5,631,912
[45] Date of Patent: May 20, 1997

[54] HIGH IMPEDANCE TEST MODE FOR JTAG

[75] Inventor: L. Randall Mote, Jr., Laguna Hills, Calif.

[73] Assignee: Samsung Electronics Co., Ltd., Seoul, Rep. of Korea

[21] Appl. No.: 574,593

[22] Filed: Dec. 19, 1995

[51] Int. Cl.$^6$ .................................................. G01R 31/28
[52] U.S. Cl. .................................... 371/22.3; 371/22.5
[58] Field of Search ........................... 371/22.3, 22.5, 371/22.6, 22.4; 324/73.1; 395/183.06

[56] References Cited

U.S. PATENT DOCUMENTS

| | | | |
|---|---|---|---|
| 5,084,874 | 1/1992 | Whetsel, Jr. | 371/22.3 |
| 5,153,882 | 10/1992 | Lyon et al. | 371/22.3 |
| 5,210,759 | 5/1993 | DeWitt et al. | |
| 5,514,975 | 5/1996 | Sartwell et al. | 371/22.5 |

OTHER PUBLICATIONS

Maunder, et al., "IEEE Standard Test Access Port and Boundary–Scan Architecture", *Institute of Electrical and Electronics Engineers, Inc.*, Oct. 21, 1993, pp. iii–A–12.

Primary Examiner—Robert W. Beausoliel, Jr.
Assistant Examiner—Trinh L. Tu
Attorney, Agent, or Firm—Knobbe, Martens, Olson & Bear LLP

[57] ABSTRACT

A specially configured JTAG test circuit allows multiple bus connections within an integrated circuit chip to be selectively placed in a high impedance state in an efficient manner. The output enable shift register locations are placed in close logical proximity to one another along the JTAG data shift register boundary scan path so that data bits need not be shifted into all of the data shift register locations within the integrated circuit chip in order to selectively enable and disable the several bus interfaces within the integrated circuit chip. In this manner, the integrated circuit chip may be isolated from selected ones of the buses connected to the integrated circuit chip, while other bus connections can remain enabled to drive others of the buses connected to the integrated circuit chip. Thus, problems associated with setting the entire integrated circuit chip in a high impedance mode are avoided.

5 Claims, 3 Drawing Sheets

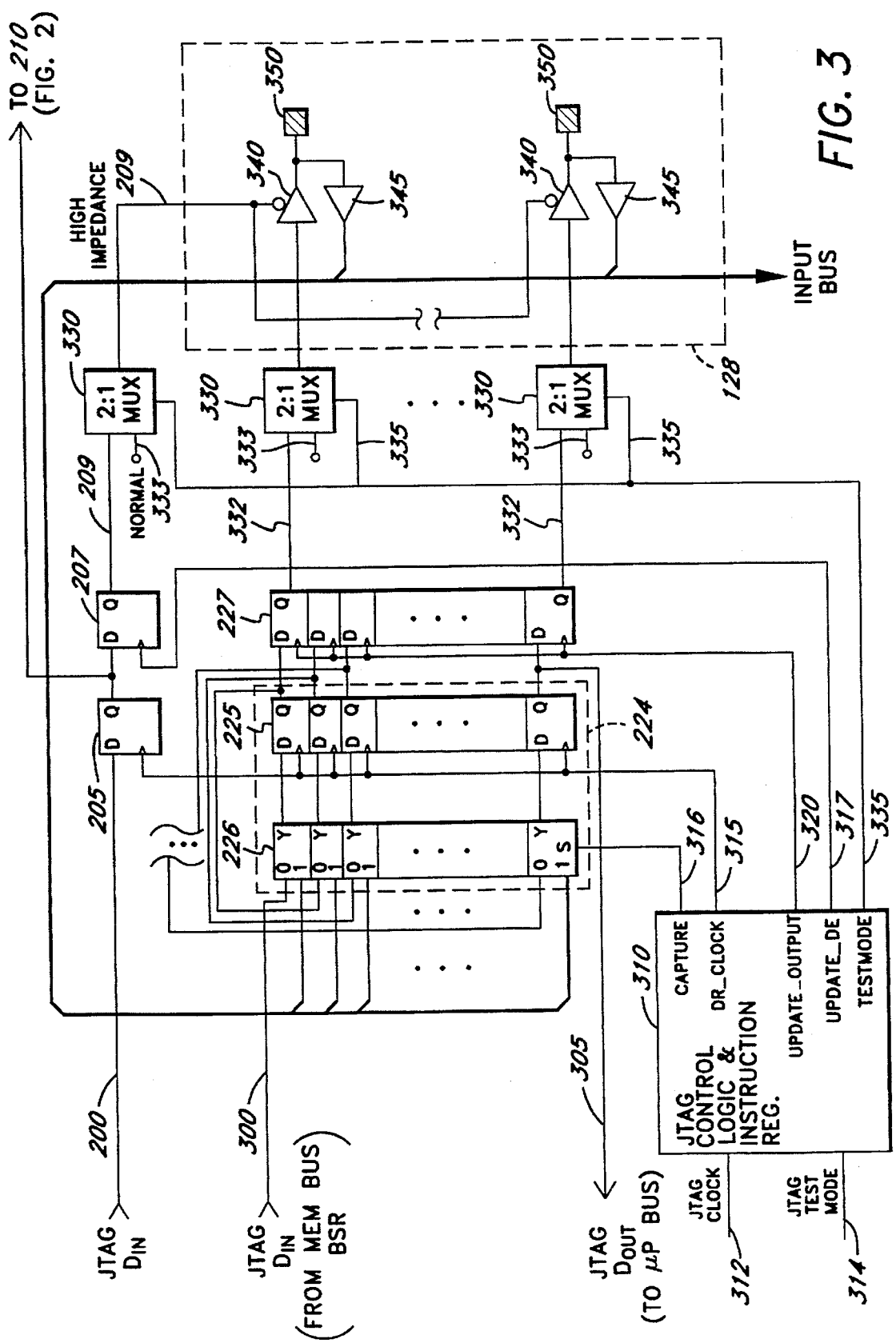

HIGH IMPEDANCE TEST MODE FOR JTAG

BACKGROUND OF THE INVENTION

1. Field Of The Invention

The present invention relates to circuits which employ JTAG boundary-scan architecture, and, in particular, to circuits having bus output enables controllable via a JTAG test register.

2. Description Of The Related Art

A well known method for testing complex integrated circuitry on, for example, a printed circuit card, is the IEEE 1149.1 boundary-scanned standard originated by the International Joint Test Action Group (JTAG), hereby incorporated by reference. One implementation of this standard involves designing components (e.g., integrated circuits) for serial boundary-scanned testing by providing shift-register elements daisy chained to form a path around the periphery of an integrated circuit component.

The general concept for serial testing using JTAG is to shift serial data into and through a number of integrated circuit components, stimulating the circuitry therein or to generate predefined output signals from the circuitry. Thereafter, data generated by the integrated circuit components or received on inputs of the integrated circuit components are shifted from the integrated circuit components to a JTAG master testing circuit.

If the data stream returned to the master testing circuit is not as expected, then a malfunction in the circuit is detected by the testing circuit. A careful analysis under software control of the deviations in the data stream may isolate any malfunctions within a circuit.

In certain instances, it is desirable to isolate a single chip, or one or more bus connections of a chip on a PC card from the rest of the circuitry on the PC card. For example, an integrated circuit (IC) chip may include internal memory bus interface circuitry, PCI bus interface circuitry, microprocessor (µP) bus interface circuitry, etc., which provide connections between the circuitry within the IC chip and the various communication buses on the PC cards. The JTAG test circuitry within the IC chip typically includes a JTAG boundary-scan data shift-register (BSR) including a bit location corresponding to each of the I/O bus connections on the IC chip. In addition, one or more bus output enable bit locations are included within the BSR. Each bus output enable bit location within the BSR chain enables the output for all or part of a bus connected to the IC chip (e.g., the processor bus, the PCI bus, the memory bus, etc.). Thus, for example, a bus output enable bit location will be associated with the PCI bus's address-data bus; another bus output enable bit will be associated with the PCI bus's control bus; etc. When the respective output enable bit location is set to the appropriate value, the output of the entire PCI bus's address-data bus interface circuitry (or the PCI bus's control interface circuitry, etc.) is enabled from the IC chip. Likewise, if the output enable bit location within the BSR is set to a non-enabling value, the entire PCI bus's address-data bus interface will assume a high impedance mode so that signals may not be transferred out of the IC chip via the PCI address-data bus interface. Of course, it will be understood to those of skill in the art, that multiple output enable bit locations of the BSR may be used to control parts of a bus interface so that, for example, 16 bits of the PCI address-data bus may be under the control of one output enable, another 16 bits under the control of another output enable, etc. Likewise, a single output enable bit in the BSR can be used to control the entire PCI bus.

If an IC chip is to be isolated from one or more of the buses connected to the IC chip, then a conventional JTAG test circuit would involve loading a data bit for each bit location within the JTAG boundary scan data register throughout the entire IC chip. Thus, for example, if four separate 64-bit buses connect to the IC chip, and each bus has a single associated bus output enable bit location in the chip's BSR, then a total of 260 BSR test bits (4×64+4) will be loaded into the BSR before each of the bus output enable bit locations are set. In a worst case scenario, all four of the buses are to be disabled so that the remaining 256 locations within the JTAG data register are "don't care" values. Thus, a conventional system may involve a great deal of inefficiency since because data bits must be shifted into the BSR in addition to the four output enable BSR bit locations. This situation is compounded by the fact that this chip's BSR might be in series with other chip's BSR's on the PC card or cards.

An alternative method of isolating an IC device from the other circuits on a PC card involves setting the entire chip into a high impedance mode using the "HIGHZ" instruction loaded into the JTAG instruction register. Although such a method alleviates the aforementioned problem of inefficiently disabling the buses, this solution allows for disabling either all or none of the buses.

However, certain applications require that selected buses of an IC device be enabled while others are disabled. For example, because many IC devices employ CMOS technology, it is important that at least one circuit on a given bus be enabled to drive the bus because CMOS circuits typically float when placed in a high impedance mode. Therefore, if all of the CMOS circuits on a bus are placed in a high impedance state so that no circuit is driving the bus to some definite state, then the bus will float so that it is possible that the bus will float midway between a high logic level and a low logic level. Such a floating condition is not desirable because a CMOS input which receives a floating input signal may have both input transistors in a partially on condition, connecting power to ground, and causing the CMOS transistors to overheat and possibly to be damaged. Consequently, when disabling a bus connection of an IC device connected to multiple buses, it is sometimes desirable to drive one or more of the remaining buses connected to the IC device so that those buses not currently being tested do not float. Therefore, a JTAG system which places either all or none of the bus connections on an IC device in a high impedance mode is not suitable for certain applications.

SUMMARY OF THE INVENTION

One aspect of the present invention is a JTAG test circuit architecture for selectively enabling and disabling peripheral connections to an integrated circuit (IC). The architecture comprises a boundary scan latch register which includes a plurality of data bit locations in electrical communication with the peripheral connections and in electrical communication with a plurality of output enable bit locations. Each of the output enable bit locations is used to enable the output of data bits stored in multiple ones of the data bit locations. A boundary scan shift register which connects to the latch register so that contents of the shift register are parallel loaded into the latch register. The shift register includes shift register data bit locations which correspond to the plurality of data bit locations in the latch register. The shift register includes shift register output enable bit locations which correspond to the output enable bit locations in the latch register. The shift register output enable bit locations are grouped in close logical proximity within the shift register so that the shift register output enable bit locations are spaced apart by fewer shift register locations than the number of data bit locations enabled by each of the output enable bit locations. A switching circuit provides a path through the shift register output enable bit locations in close logical proximity while the switching circuit is in a first state. The switching circuit provides a path through the shift register output enable bit locations and the shift register data bit locations while the switching circuit is in a second state.

Preferably, the shift register output enable bit locations are connected in series and are logically adjacent to one another. Also preferably, the switching circuit comprises a multiplexer (also referred to hereinafter as a mux). In particularly preferred embodiments, the switching circuit connects to a JTAG output.

Another aspect of the present invention is a method of selectively enabling and disabling peripheral connections to an integrated circuit (IC) using a JTAG boundary scan test circuit. The method comprises the step of connecting output enable elements and data test bit elements within a serial boundary scan shift register so that a first path is provided through the output enable elements and data test bit elements and a second path is provided only through the output enable elements. Information stored in the output enable elements selectively enables electrical communication to take place between the data test bit elements and the peripheral connections. The method includes the further steps of generating a bit stream used for JTAG boundary scan testing; selecting between the first and second paths; and shifting the generated bit stream through the serial boundary scan shift register.

BRIEF DESCRIPTION OF THE DRAWINGS

FIG. 3 is a schematic block diagram which details the JTAG circuitry as a JTAG circuitry connects a bus interface.

DETAILED DESCRIPTION OF THE PREFERRED EMBODIMENT

Figure 1:
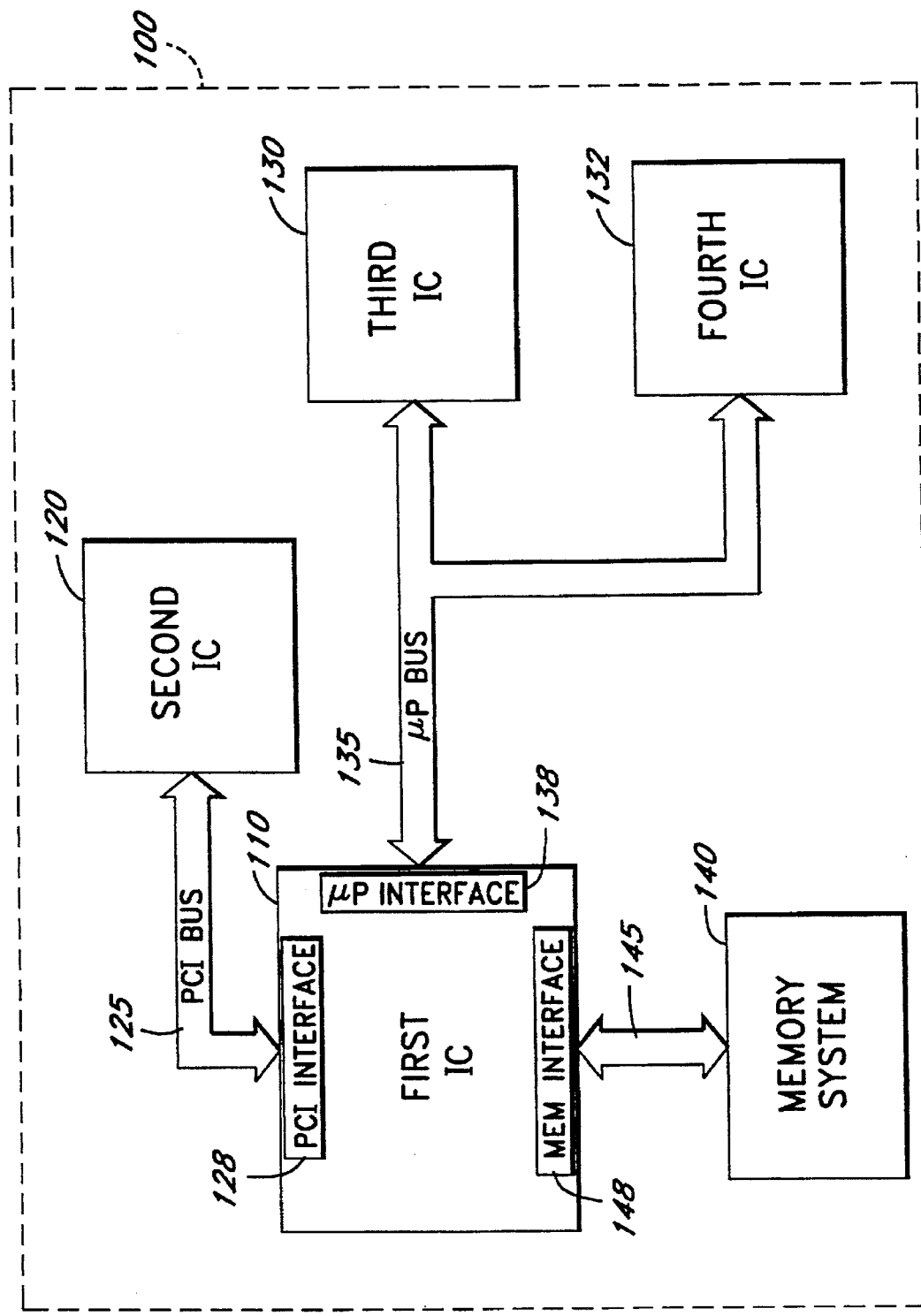
FIG. 1 is a simplified schematic block diagram of a printed circuit (PC) card including an integrated chip which interfaces with multiple buses on the PC card.

FIG. 1 is a highly simplified schematic block diagram which shows multiple integrated circuit devices connected on a printed circuit (PC) card 100. Specifically, a first integrated circuit (IC) chip 110 connects to a second IC 120 via a PCI bus 125 and a PCI interface 128. The first IC 110 further connects to a third IC 130, and a fourth IC 132 via a processor bus 135 and a processor interface 138. The IC 110 is connected to a memory system 140 via a memory bus 145 and a memory interface 148. For example, the IC 120 advantageously comprises a PCI-to-PCI bridge, the IC's 130, 132 advantageously comprise multi-processors, and the memory system 140 advantageously comprises a DRAM-array.

In operation, the IC 110 communicates with the various circuit elements 120, 130, 132, 140 within the PC 100 via the buses 125, 135, 145. If it is desirable to test the processor bus 135 using JTAG and outputting data from IC 130, then, in order to prevent circuitry within the IC 110 from interfering with the JTAG testing, it is necessary to isolate outputs of the IC 110 from the processor bus 135. That is, IC 110's processor interface 138 must be placed in a high impedance mode so that its JTAG input latches can capture the JTAG output test data from IC 130.

As discussed briefly above, one option would be to place the entire IC 110 into a high impedance state so that the PCI interface 128, the processor interface 138, and the memory interface 148 all enter a high impedance mode. However, such a method may be impractical if either the bus 125 or the bus 145 needs to be driven by the IC 110. That is, for example, if the IC 120 is a CMOS device having an interface with the PCI bus 125 which is also in the high impedance mode or is an input signal, then the PCI bus 125 will float since no circuit is used to drive the bus 125. In this instance, it would be necessary to set only the processor interface 138 in the high impedance mode while the PCI interface 128 is used to the drive the PCI bus 125. As noted above, conventional methods of achieving this may require hundreds of shifts into the JTAG data registers to set only a couple of output enable bits within the JTAG data registers.

Figure 2:
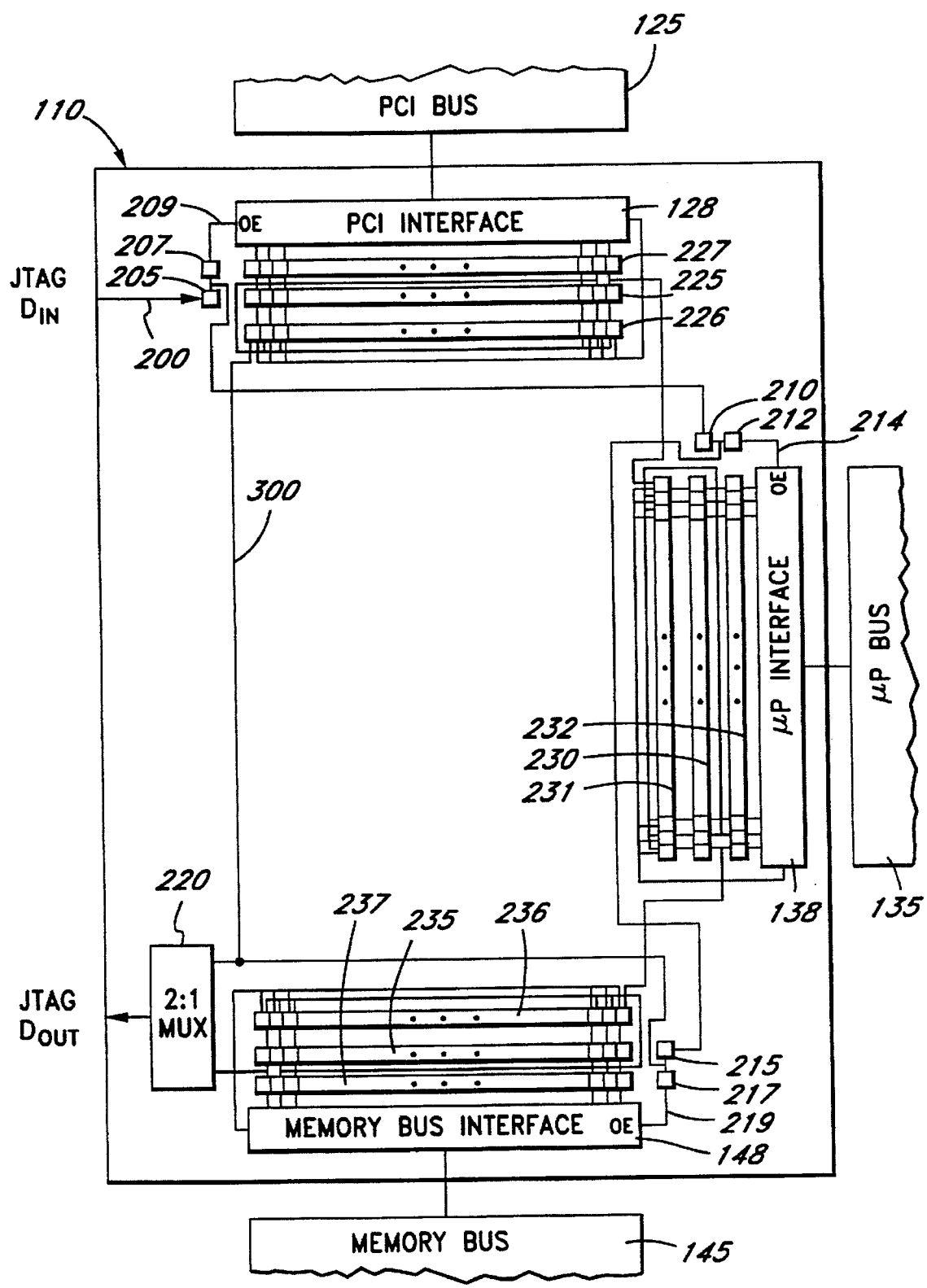
FIG. 2 is a schematic block diagram which shows the integrated circuit chip of FIG. 1 in greater detail.

FIG. 2 is a simplified schematic block diagram which illustrates certain of the internal components of the IC 110 as constructed in accordance with the present invention. The JTAG boundary scan chain and circuitry within the IC 110 are specially configured to overcome the disadvantages of the previous circuits. Specifically, in accordance with the present invention, the JTAG test circuit is configured so that each of the output enable locations within the JTAG BSR are strung together (e.g., in adjacent locations within the JTAG boundary scan data shift register) so that the output enable bits used to the control the impedance mode of the interfaces 128, 138, 148 can be shifted through in the minimum required time (i.e., without shifting into any of the other BSR locations).

Thus, as shown in FIG. 2, a JTAG data input line (JTAG DIN) 200 connects directly to an output enable data shift register location 205. The shift register location 205 connects to a latch 207, for latching the data bit shifted into the location 205 once the appropriate value is shifted into the location 205. The latch 207, in turn, connects to a JTAG test output enable line 209 of the PCI interface 128. The data bit stored in the latch 207 is applied to the PCI interface 128 via the line 209 to enable or disable the outputs of the entire PCI bus interface 128 in the example depicted in FIG. 2 when in JTAG test mode. However, it will be understood that multiple output enable bits could be used to selectively control output portions of the PCI bus 125 (this is true for all other buses, as well). The second element in the data shift register is the output enable location 210 which connects in series with the location 205 (i.e., the location 210 is the next location shifted into from the location 205). The data register output enable location 210 also connects to a latch 212, which, in turn, connects to the JTAG test output enable of the processor interface 138 via a line 214. As with the PCI bus interface 128, the output enable bit in the latch 212 is used to enable or disable the outputs for the entire processor bus 135 when in JTAG test mode in this example. Finally, an output enable shift register location 215 connects in series with the location 210 so that the three output enable shift register locations 205, 210 and 215 are adjacent to one another. The output enable location 215 also connects to a latch 217 which, in turn, connects to the JTAG test output enable of the memory bus interface 148 via a line 219. Again, the output enable bit held in the latch 217 can be used to enable or disable the entire memory bus interface 148 when in JTAG test mode.

The output of the BSR location 215 connects to the input of a 2-to-1 multiplexer (2:1 MUX) 220 as well as to the first element in a BSR 224 formed by a mux 226 and D flip-flops 225. It should be appreciated that as used herein, a location in the BSR 224 designates one of the multiplexers 226 together with the corresponding D flip-flop 225. The BSR 224 is a portion of the JTAG boundary scan data register and serves specifically to provide test data for BSR output latch register 227, and to lines on the PCI bus 125 via the PCI interface 128. Data from the PCI bus 125 can be input to the boundary scan input mux 226, which can be loaded into the boundary scan register 225, for the purpose of collecting test input data. The connection between the data shift register 225 and the PCI bus 125 will be described in greater detail below with reference to FIG. 3. By connecting the output of the shift register location 215 to both the multiplexer 220 and the BSR segment 224, two possible paths are provided for the JTAG data which is input over the line 200. Specifically, if it is desired to control only the output enable bits associated with each of the interfaces 128, 138, 148, then the shortest possible JTAG path is provided via the line 200, the shift register locations 205, 210, 215, and the multiplexer 220. However, if it is also desired to update or sample the entire BSR, then test data can be shifted through the output enable portion (200, 128, 138 and 148) then it can be shifted through the remaining I/O sections of the BSR (i.e., shift registers 225, 230 and 235). It can then be shifted out via a second input of the multiplexer 220. Data from the microprocessor bus 135 and the memory bus 145 can be input to boundary scan input muxes 231, 236, respectively. The muxes 231, 236, in a manner similar to that used by the mux 226, can be loaded into the boundary scan shift registers 230, 235, respectively, for the purpose of collecting test input data. In this manner, efficient control of the output enables associated with each of the interfaces 128, 138, 148 is provided by electrically connecting the BSR segments for the output enables in close logical proximity to each other via the above-described JTAG connections so that the BSR locations controlling the output enables can be logically isolated from the other JTAG BSR segments.

Of course, it will be understood by those of ordinary skill in the art that the configuration of FIG. 2 is exemplary so that it is possible that other configurations which involve grouping the output enable BSR locations in close proximity may also be used in accordance with the present invention. Furthermore, a series of multiplexer switches may be interspersed throughout the BSR path in order to bypass certain ones of the data registers 225, 230, or 235. Such modifications are depicted, for example, in the above-incorporated document (IEEE 1149.1). It will also be appreciated that, like the shift register 225, the shift registers 230, 235 are able to parallel load data into respective latch registers 232, 237. The data latch registers 227, 232 and 237 may be used to test the circuitry which connects to the PCI bus 125, the processor bus 135, and the memory bus 145, respectively.

FIG. 3 is a schematic block diagram which details the connection between the data shift register 225 and the PCI bus 125 via the latch registers 227, mux 231, and the PCI interface 128. As shown in FIG. 3, JTAG input bits are shifted via a line 300 in to the input of the JTAG BSR 224 and out the output of the location in register 225 via a line 305. The shifting of data bits through their shift register 230 is accomplished under the control of a clock signal provided via a line 315 from the JTAG control logic 310. The control logic 310 receives test clock and test mode signals via lines 312, 314, respectively. The control logic 310 provides the clock output over line 315, a capture output 316, an update-output signal 320, and a update-oe signal 317, as is well known in the art. The separate update signals (320 and 317) allows the test output data in 227 to remain unchanged when updating the output enables only via the shortened BSR mode.

Once all of the appropriate JTAG test data bits have been shifted into the data shift register 225 under the control of the DR-CLOCK the data is then captured in the latch circuit 227 under the control of the update-output signal provided on the line 320. That is, each of the data bits within the shift register 225 are parallel loaded into the latch register 227. For the sake of simplicity, only two connection pads are shown in FIG. 3, both of which connect to output pads via the PCI interface circuit 128.

In every JTAG boundary test circuit, a multiplexer is included which selects between the JTAG test vector and the normal circuitry which connects to the output leads of the IC 110 when JTAG is not being used. Thus, as shown in FIG. 3, each of the bit locations within the latched data registered 227 connects to first inputs, respectively, of the multiplexers 330 via respective lines 332. Second inputs of the multiplexers 330 connect to the normal circuitry within the IC 110 via respective lines 333. A select input 335 to each multiplexer 330 allows selection between a conventional JTAG test mode and the normal operational mode via the decoded output of the JTAG instruction register 310. The output of each multiplexer 330 enters the PCI interface 128 which includes a plurality of bidirectional tri-state buffers 340, 345. As shown in FIG. 3, the output buffers 340 provide output paths to respective external connection pads 350 while the input buffers 345 provide input paths from the connection pads 350 to circuitry internal to the IC chip 110. As shown in FIG. 3, the line 209 connects to all of the tri-state buffers 340 so that, when the output enable signal applied to the line 209 is active, each of the buffers 340 enters a high impedance mode. In this manner the busses connected to the IC 110 can be efficiently and selectively placed in the high impedance mode.

Although not essential for implementation of the present invention, it should be noted that the pads 350.further connect to respective elements of the mux 226 via the input buffers 345 so that data on the input pads can be sampled and latched into the shift register 225.

Although the present invention has been described in detail above, it should be understood that the foregoing description is illustrative and not restrictive. Those of ordinary skill in the art will appreciate that many obvious modifications can be made to the invention without departing from its spirit or essential characteristics. Accordingly, the scope of the invention should be interpreted in view of the following appended claims.

What is claimed is:

1. A JTAG test circuit architecture for selectively enabling and disabling peripheral connections to an integrated circuit (IC), said architecture comprising:

a boundary scan latch register including a plurality of data bit locations in electrical communication with said peripheral connections and in electrical communication with a plurality of output enable bit locations, each of said output enable bit locations used to enable the output of data bits stored in multiple ones of said data bit locations, wherein information stored in said output enable bit locations selectively places a plurality of said peripheral connections in a high impedance mode to selectively disable electrical communication between said data bit locations and said peripheral connections; and a boundary scan shift register which connects to said latch register so that contents of said shift register are parallel loaded into said latch register, said shift register including shift register data bit locations corresponding to said plurality of data bit locations in said latch register and including shift register output enable bit locations corresponding to said output enable bit locations in said latch register, said shift register output enable bit locations being grouped in close logical proximity within said shift register so that said shift register output enable bit locations are logically spaced apart by fewer shift register locations than the number of data bit locations enabled by each of said output enable bit locations; and a switching circuit which provides a first path through only said shift register output enable bit locations in close logical proximity while said switching circuit is in a first state, and which provides a second path through said shift register output enable bit locations and through said shift register data bit locations while said switching circuit is in a second state, said first path permitting states of said shift register output enable bit locations to be changed without changing states of said shift register data bit locations.

2. A JTAG test circuit architecture as defined in claim 1, wherein said shift register output enable bit locations are connected in series and are logically adjacent to one another.

3. A JTAG test circuit architecture as defined in claim 1, wherein said switching circuit comprises a multiplexer.

4. A JTAG test circuit architecture as defined in claim 1, wherein said switching circuit connects to a JTAG output.

5. A method of selectively enabling and disabling peripheral connections to an integrated circuit (IC) using a JTAG boundary scan test circuit having a plurality of shift register output enable elements being grouped in close logical proximity within a serial boundary scan shift register so that said shift register output enable bit locations are logically spaced apart by fewer shift register elements than the number of data test bit locations enabled by each of a plurality of output enable elements, said method comprising the steps of:

connecting said output enable elements and data test bit elements within said serial boundary scan shift register so that a first path is provided through said output enable elements and data test bit elements and a second path is provided only through said output enable elements, wherein information stored in said output enable elements selectively places a plurality of said peripheral connections in a high impedance mode to selectively disable electrical communication between said data test bit elements and said peripheral connections;

generating a bit stream used for JTAG boundary scan testing;

selecting between said first and second paths; and shifting said generated bit stream through said serial boundary scan shift register.

* * * * *